US011390531B2

(12) United States Patent
Lee et al.

(10) Patent No.: US 11,390,531 B2
(45) Date of Patent: Jul. 19, 2022

(54) MESOPOROUS SILICA FILM STRUCTURE HAVING ULTRA-LARGE PORE AND METHOD OF MANUFACTURING THE SAME

(71) Applicant: KOREA INSTITUTE OF SCIENCE AND TECHNOLOGY, Seoul (KR)

(72) Inventors: Joon Seok Lee, Seoul (KR); In Ae Lee, Seoul (KR); Hui Jin Jung, Seoul (KR); Seok Lee, Seoul (KR); Deok Ha Woo, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 122 days.

(21) Appl. No.: 16/897,037

(22) Filed: Jun. 9, 2020

(65) Prior Publication Data
US 2021/0300770 A1 Sep. 30, 2021

(30) Foreign Application Priority Data
Mar. 26, 2020 (KR) .................. 10-2020-0036659

(51) Int. Cl.
*C01B 33/18* (2006.01)
*C23C 18/06* (2006.01)
(Continued)

(52) U.S. Cl.
CPC .............. *C01B 33/18* (2013.01); *C23C 18/06* (2013.01); *C23C 18/1208* (2013.01);
(Continued)

(58) Field of Classification Search
CPC ................ C23C 18/06; C23C 18/1208; C23C 18/1254
See application file for complete search history.

(56) References Cited

U.S. PATENT DOCUMENTS 7,060,329 B2 * 6/2006 Kelley .................. B82Y 30/00
427/261
8,231,966 B2 * 7/2012 Imai .................... C23C 18/1245
428/304.4

FOREIGN PATENT DOCUMENTS

KR 10-1558240 B1 10/2015

OTHER PUBLICATIONS

Yang, Synthesis, characteriazation and catalytic application of mesoporous W-MCM-48 for the selective oxidation of cyclopentene to glutaraldehyde, Journal of Molecular Catalysis A: Chemical, 241, 2005, p. 205-214 (Year: 2005).*
(Continued)

*Primary Examiner* — Tabatha L Penny
(74) *Attorney, Agent, or Firm* — Goldilocks Zone IP Law

(57) ABSTRACT

The present invention relates to a mesoporous film structure having ultra-large pores therein and a method of manufacturing the same, which includes, The manufacturing method includes a pretreatment step of pretreating a support so that micelles and silica are deposited on the support, a micelle formation step of mixing a cationic surfactant and an anionic co-surfactant for forming the micelles at a predetermined ratio in a support-carried water tank prepared in the pretreatment step, followed by heating, thus forming enlarged micelles on the support through magnetic bonding of the cationic surfactant and the anionic co-surfactant, a silica deposition step of supplying a silica precursor solution to the water tank, followed by heating, thus depositing silica on the support after the micelle formation step, and a washing step of washing the support so that residual materials (containing the micelles) are removed after the silica deposition step.

10 Claims, 8 Drawing Sheets

(51) Int. Cl.
 *C23C 18/12* (2006.01)
 *H01L 21/02* (2006.01)
(52) U.S. Cl.
 CPC ...... *C23C 18/1254* (2013.01); *C01P 2006/16* (2013.01); *H01L 21/02126* (2013.01)

(56) References Cited

OTHER PUBLICATIONS

Yang, Structure-Dependent and Glutathione-Responsive Biodegradable Dendritic Mesoporous Organosilica Nanoparticles for Safe Protein Delivery, Chemistry of Materials, 28, 2016, p. 9008-9016 (Year: 2016).*

Fu, Synthesis of Mesoporous Silica-Coated Magnetic Nanocomposites using Polyehtylene-Glycol0Polylactic Acid as a New Template, Journal of Nanoscience and Nanotechnology, vol. 17, 2017, p. 3077-3083 (Year: 2017).*

Sanchez, Design, Synthesis, and Properties of Inorganic and Hybrid Thin Films Having Periodically Organized Nanoporosity, Chem . Mater., 2008, 20, 3, p. 682-737 (Year: 2008).*

Jackman, Using Elastomeric Membranes as Dry Resists for Dry Lift-Off, Langmuir, 1999, 15, p. 2973-2984 (Year: 1999).*

Rohlfing, Low-Temperature Synthesis of Mesoporous Titania-Silica Films with Pre-Formed Anatase Nanocrystals, Chem. Mater., 2009, 21, 12, p. 2410-2417 (Year: 2009).*

Chen, Synthesis of MCM-48 Using Mixed Cationic-Anionic Surfactants as Templates, Chem. Mater., 1997, 9, p. 2685-2686 (Year: 1997).*

Kim, Flow-Induced Silica Structure during in Situ Gelation of Wormy Micellar Solutions, Langmuir, 2000, 16, 4761-4765 (Year: 2000 ).*

Ohkubo, Synthesis of highly-ordered mesoporous silica particles using mixed cataionic and anionic surfactants as templates, Journal of Colloid and Interface Science, vol. 312, Issue 1, 2007, p. 42-46 (Year: 2007).*

* cited by examiner

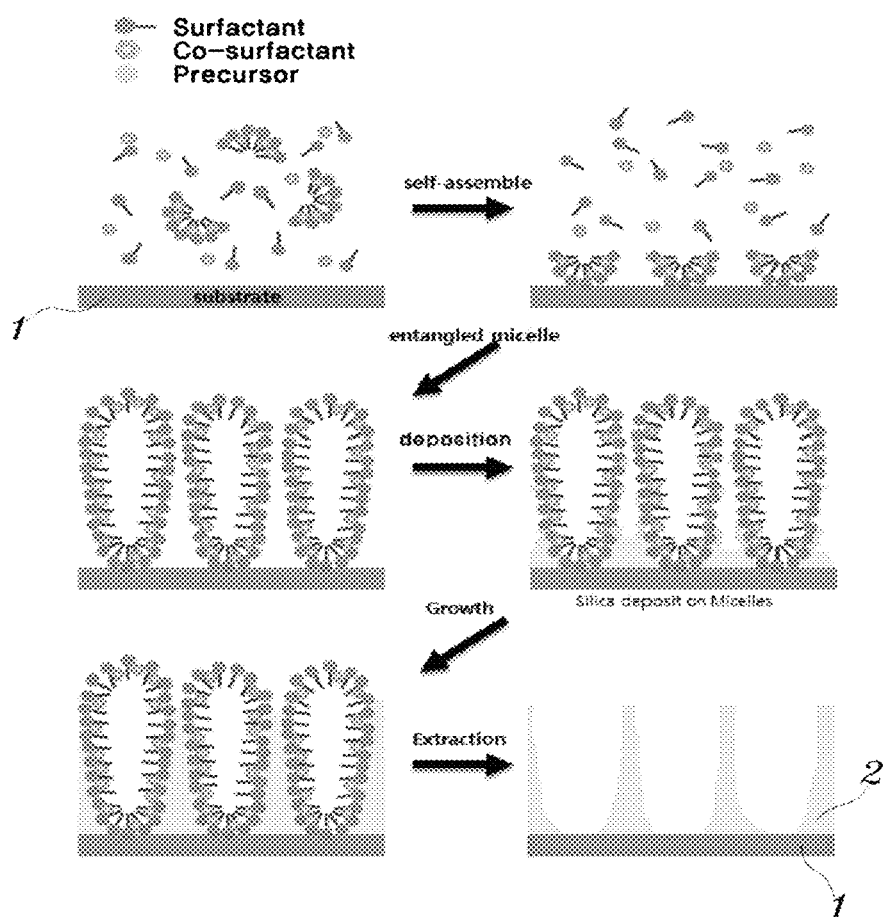
[FIG.1]

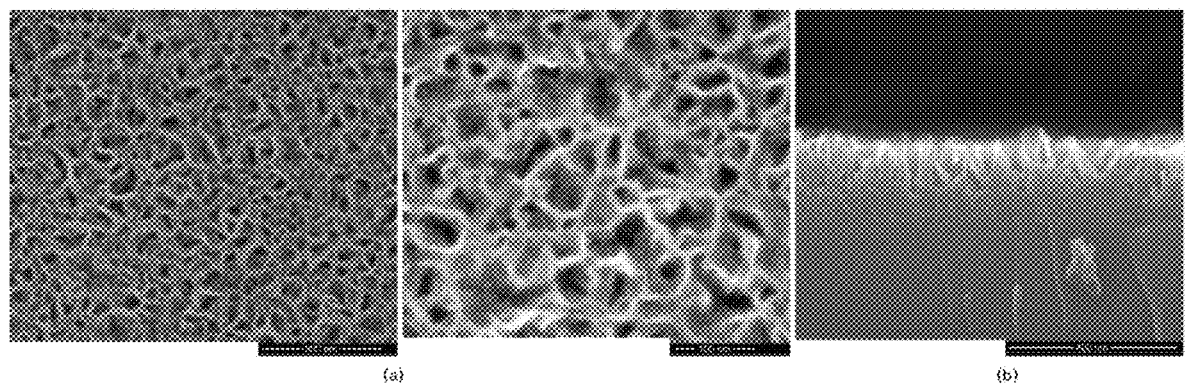
[FIG.2]
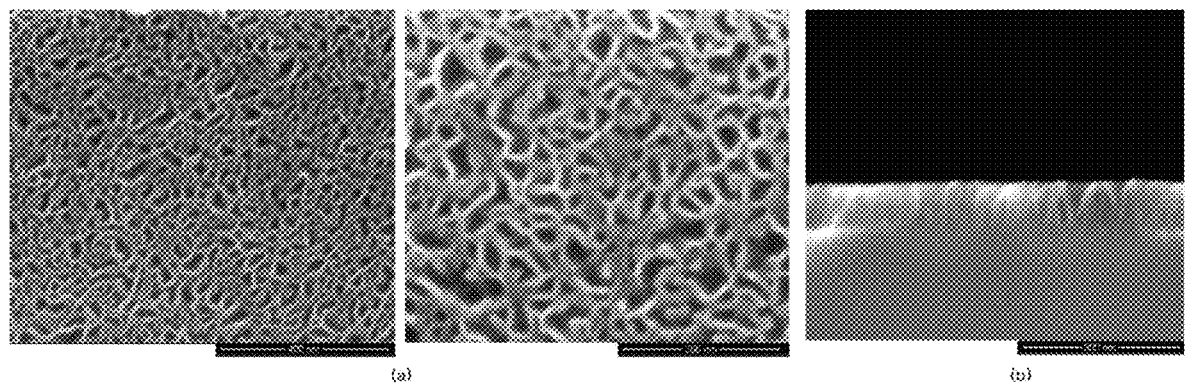
[FIG.3]

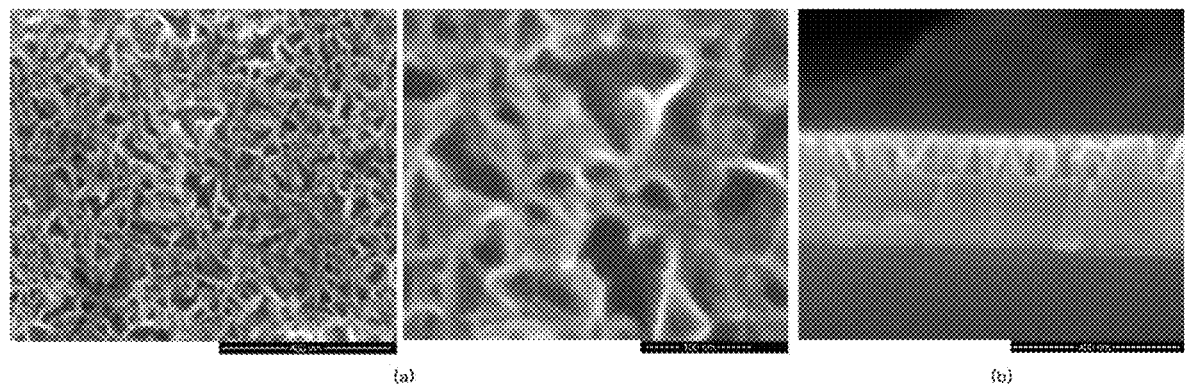
[FIG.4]
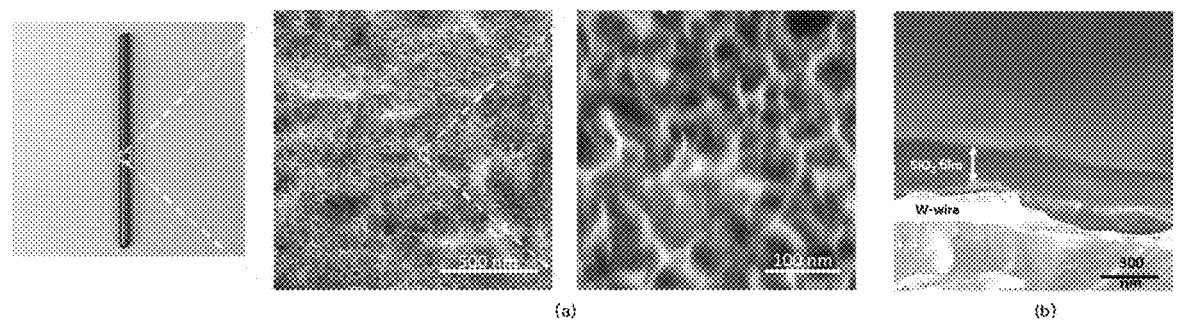
[FIG.5]

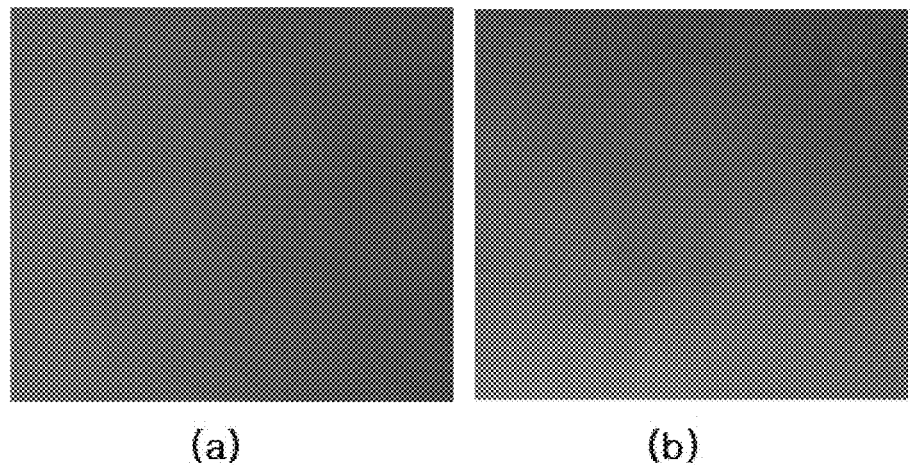
[FIG.6]
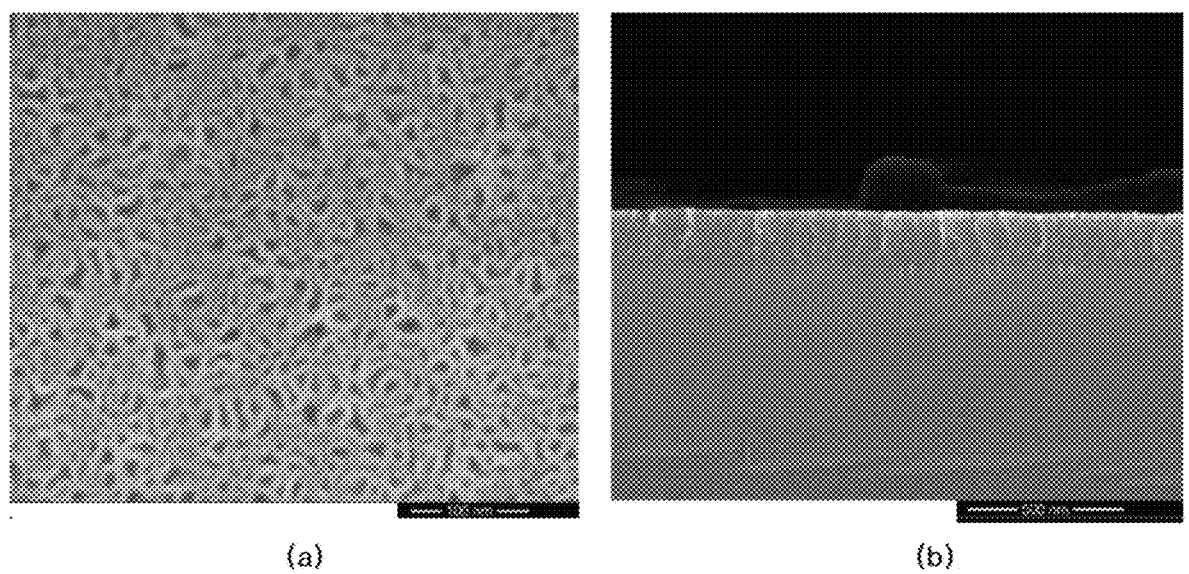
[FIG.7]

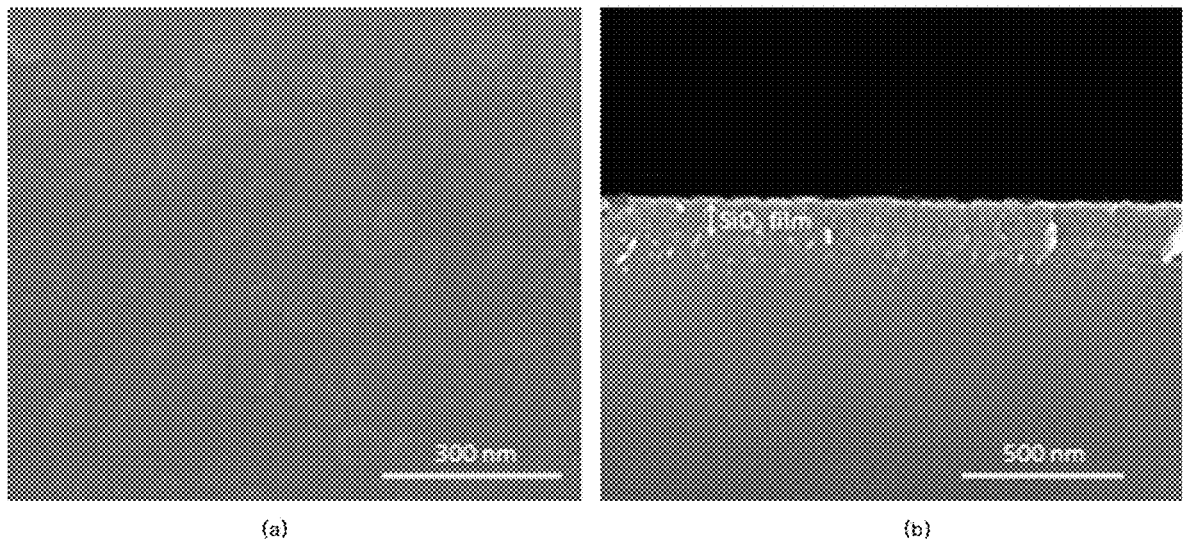
[FIG.8]
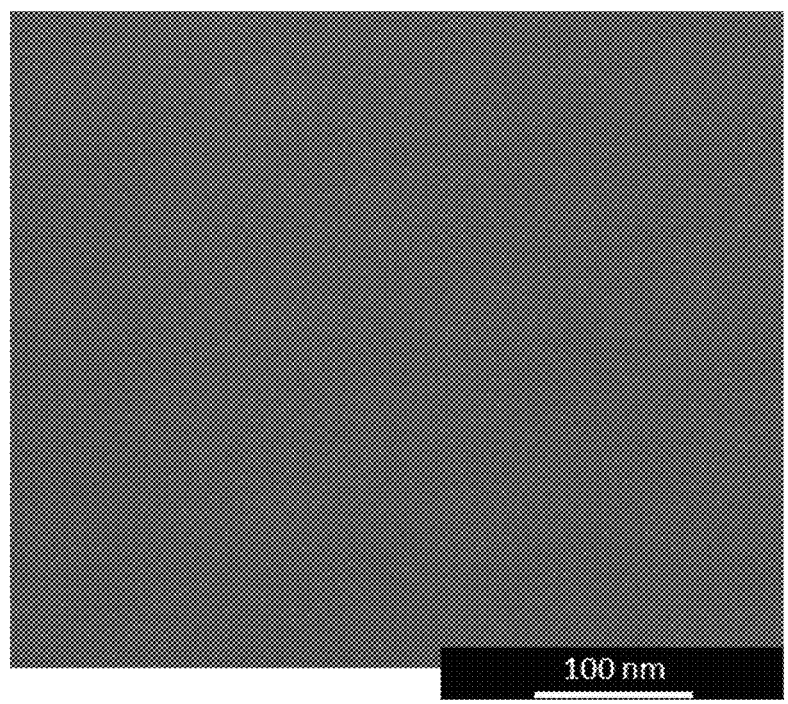
[FIG.9]

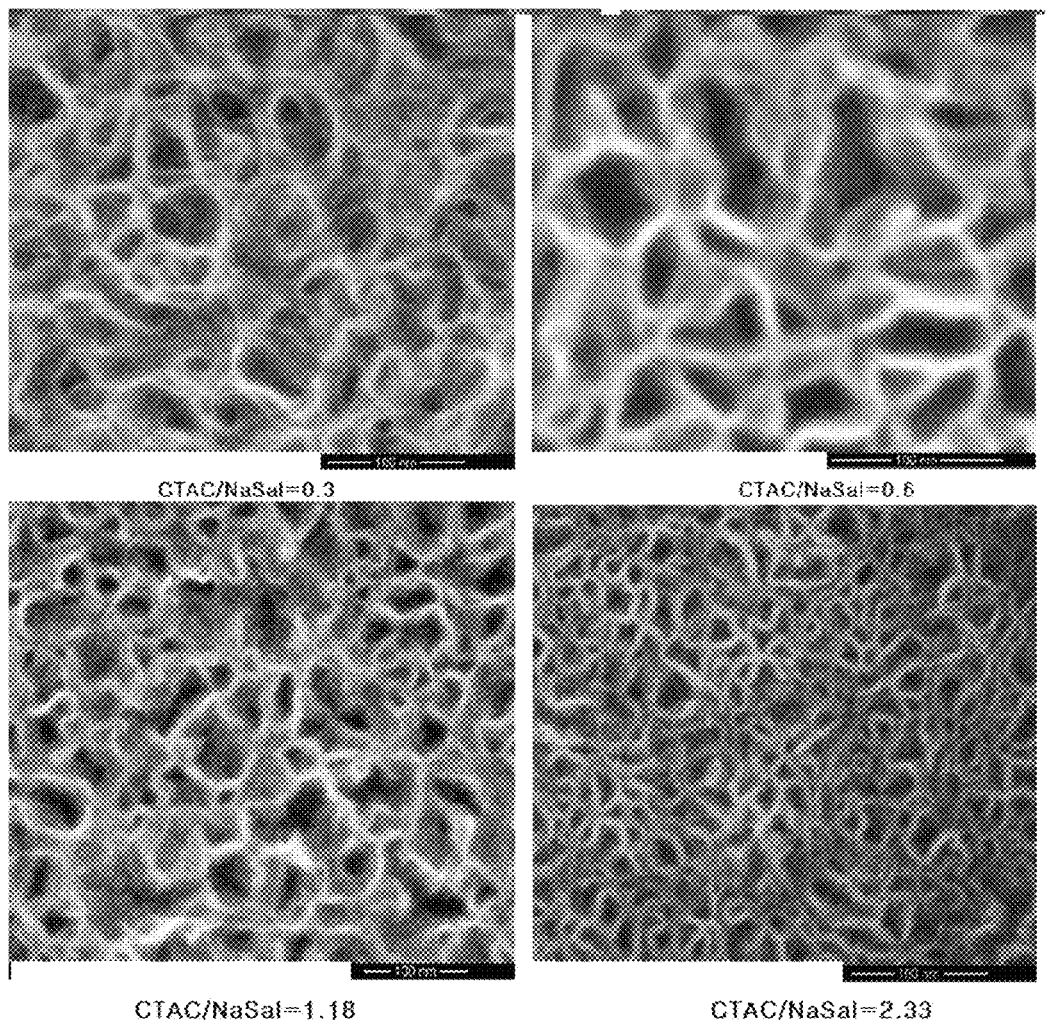
[FIG.10]

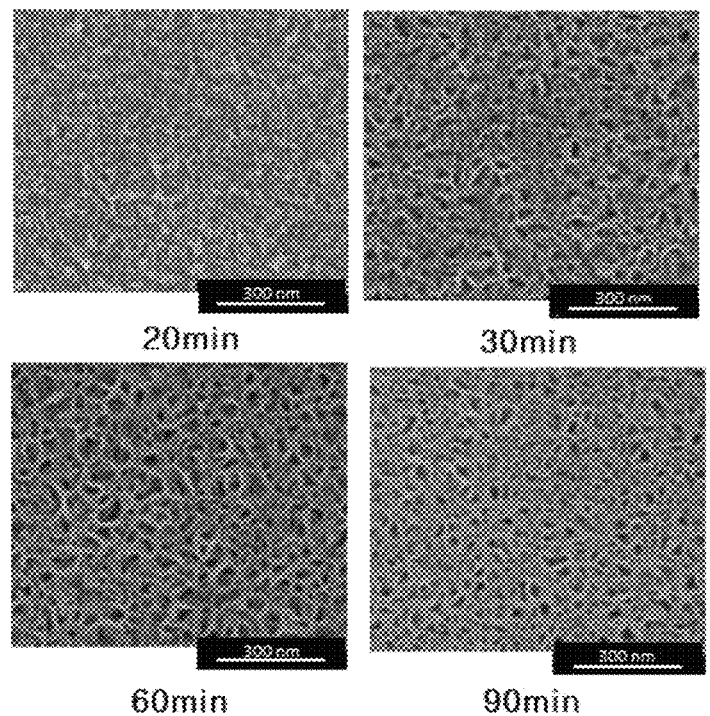
[FIG.11]
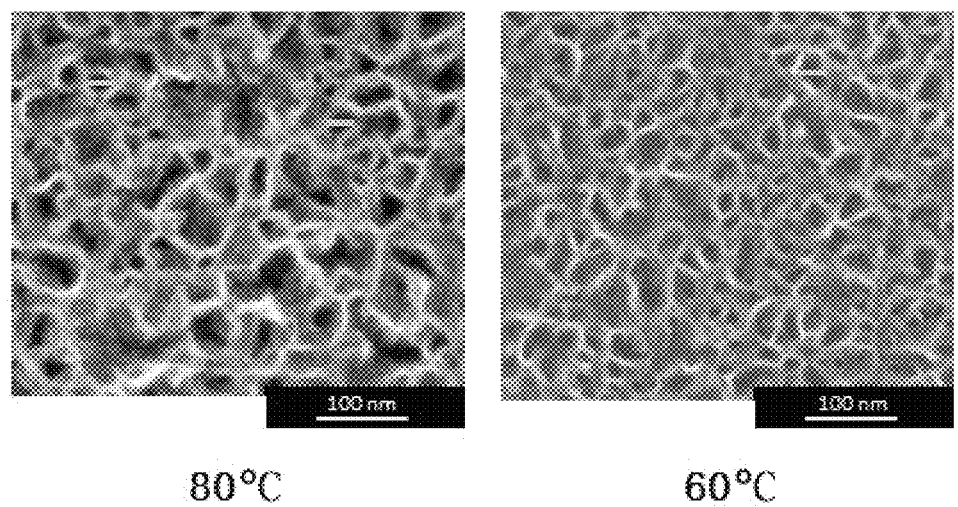
[FIG.12]

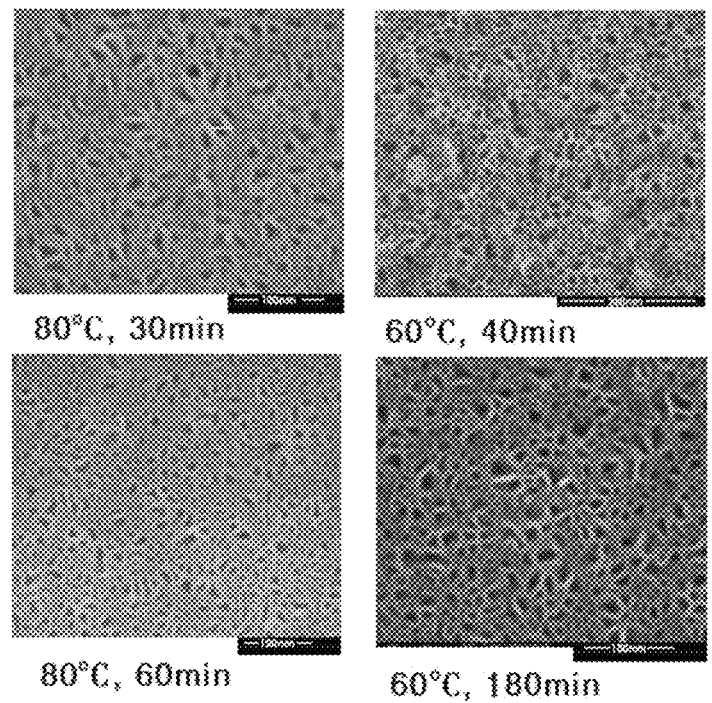
[FIG.13]
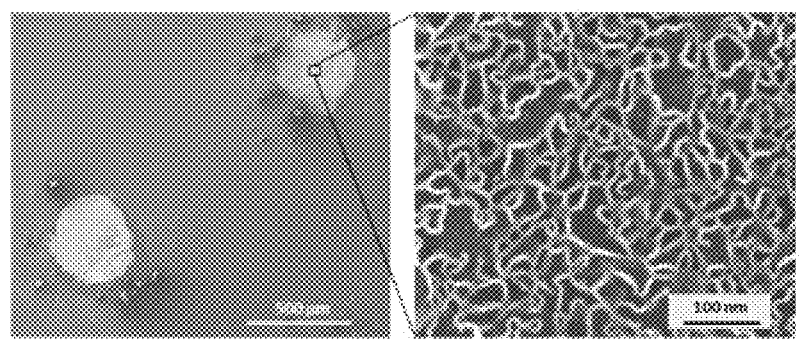
[FIG.14]

MESOPOROUS SILICA FILM STRUCTURE HAVING ULTRA-LARGE PORE AND METHOD OF MANUFACTURING THE SAME

CROSS REFERENCE TO RELATED APPLICATION

The present application claims priority based on Korean Patent Application No. 10-2020-0036659, filed on Mar. 26, 2020, the entire content of which is incorporated herein for all purposes by this reference.

BACKGROUND OF THE INVENTION

1. Field of the Invention

The present invention relates to a mesoporous film structure having ultra-large pores therein and a method of manufacturing the same. More particularly, the present invention relates to a mesoporous film structure having ultra-large pores therein and a method of manufacturing the same, in which a mesoporous film having ultra-large pores therein is formed on supports including various materials and having various shapes under chemically mild conditions. The size of the pores in the film is capable of being adjusted, and a patterned mesoporous structure is formed on the upper surface of the support rather than throughout the entire support.

2. Description of the Related Art

A mesoporous film including silica or silicon and having ultra-large pores therein may be used in various fields such as those of catalysts, adsorption, sensors, solar cells, biotechnology, and biomedical devices due to the excellent properties thereof, such as the large surface area, large pore size (several tens nm), and ease of surface modification.

As described in the patent document below, when a mesoporous film is manufactured according to a method of manufacturing mesoporous silica nanomaterials using a typical sol-gel reaction, the pore size thereof is as small as a few nanometers and it is difficult to adjust the pore size, making it difficult to apply the mesoporous film to various fields. Therefore, in order to manufacture a mesoporous film having ultra-large pores, for example, a method such as electric etching, performed in a hydrofluoric acid solution, is used.

Patent Document

Korean Patent No. 10-1558240 (registered on Oct. 1, 2015) "Method of manufacturing mesoporous oxide macroparticles and mesoporous oxide macroparticles manufactured using the same"

However, when the above conventional manufacturing method is used, there are problems in that the structure is not applicable to a support including a plastic plate or film material having low chemical resistance because the structure is formed only on a silicon substrate, in that a patterned mesoporous structure is not capable of being formed on the support, and in that a mesoporous film is not capable of being formed on various types of supports.

SUMMARY OF THE INVENTION

Accordingly, the present invention has been made keeping in mind the above problems occurring in the related art, and an object of the present invention is to provide a manufacturing method of forming a mesoporous film having ultra-large pores therein on supports including various materials (silicon, glass, metal, and plastics) and having various shapes (a plate, a rod, a line, a sphere, and a flexible film) under chemically mild conditions (pH of 6 to 9, to 80° C.).

Another object of the present invention is to provide a manufacturing method in which the pore size of a film is capable of being adjusted and a patterned mesoporous structure is formed on the upper surface of a support rather than throughout the entire support.

The present invention is implemented by embodiments having the following constitutions in order to achieve the above objects.

According to an embodiment of the present invention, a method of manufacturing a mesoporous silica film structure includes a micelle formation step of mixing a cationic surfactant and an anionic co-surfactant for forming micelles at a predetermined ratio in a support-carried water tank, followed by heating, thus forming enlarged micelles on a support through magnetic bonding of the cationic surfactant and the anionic co-surfactant, a silica deposition step of supplying a silica precursor solution to the water tank, followed by heating, thus depositing silica on the support after the micelle formation step, and a washing step of washing the support so that residual materials containing the micelles are removed to thus obtain a structure including the support and a mesoporous silica film formed on the support after the silica deposition step.

According to another embodiment of the present invention, in the method of manufacturing the mesoporous silica film structure, CTAC is used as the cationic surfactant, and one or more selected from the group consisting of sodium salicylate, salicylic acid, sodium benzoate, benzoic acid, sodium methoxybenzoate, 2-methoxybenzoic acid, sodium cinnamate, cinnamic acid, sodium hydroxycinnamate, hydrocinnamic acid, sodium methoxycinnamate, methoxycinnamic acid, sodium 3-phenylpropanate, and 3-hydroxyphenylpropanoic acid are used as the anionic co-surfactant.

According to another embodiment of the present invention, in the method of manufacturing the mesoporous silica film structure, the anionic co-surfactant is used in an amount of 0.1 to 3 moles based on 1 mole of the cationic surfactant.

According to another embodiment of the present invention, in the method of manufacturing the mesoporous silica film structure, the film has a thickness of 100 to 300 nm and includes pores having a diameter of 10 to 50 nm.

According to another embodiment of the present invention, in the method of manufacturing the mesoporous silica film structure, a ratio of the cationic surfactant and the anionic co-surfactant, a reaction temperature, and a reaction time are adjusted to control the pore size of the film.

According to another embodiment of the present invention, in the method of manufacturing the mesoporous silica film structure, in the silica deposition step, the precursor solution has a pH of 6 to 9 and is maintained at a temperature of 40 to 80° C.

According to another embodiment of the present invention, in the method of manufacturing the mesoporous silica film structure, any one among silicon, glass, ITO-coated glass, plastic, metal, a flexible film, and a transparent film is used as the support.

According to another embodiment of the present invention, in the method of manufacturing the mesoporous silica film structure, the support has any one shape among a plate, a line, a rod, and a sphere.

According to another embodiment of the present invention, the method of manufacturing the mesoporous silica film structure further includes a mask-bonding step of bonding a shadow mask to the support between a pretreatment step and the micelle formation step. The patterned mesoporous silica film having ultra-large pores therein is formed on the support.

According to another embodiment of the present invention, in the method of manufacturing the mesoporous silica film structure, the shadow mask includes PDMS and has a hole formed vertically therethrough.

According to another embodiment of the present invention, the method of manufacturing the mesoporous silica film structure further includes, before the micelle formation step, a pretreatment step of immersing a tungsten wire, which is the support, in an isopropanol solution, ultrasonically washing the tungsten wire, rinsing the tungsten wire using distilled water, dipping the tungsten wire in a NaOH solution, rinsing the tungsten wire using distilled water, and storing the tungsten wire in an ethanol solution. The micelle formation step includes adding the support to the water tank containing water and TEA, performing agitation and heating, ultrasonicating the water tank to remove air bubbles present on a surface of the support, adding the cationic surfactant and the anionic co-surfactant at a predetermined ratio, and maintaining an agitated and heated state.

The present invention may obtain the following effects by the above embodiments.

In the present invention, it is possible to form a mesoporous film having ultra-large pores therein on supports including various materials (silicon, glass, metal, and plastics) and having various shapes (a plate, a rod, a line, a sphere, and a flexible film) under chemically mild conditions (pH of 6 to 9, 40 to 80° C.).

Further, in the present invention, it is possible to adjust the pore size of a film and to form a patterned mesoporous structure on the upper surface of a support rather than throughout the entire support.

BRIEF DESCRIPTION OF THE DRAWINGS

The above and other objects, features and advantages of the present invention will be more clearly understood from the following detailed description taken in conjunction with the accompanying drawings, in which:

FIG. 1 is a reference view for explaining a method of manufacturing a structure according to an embodiment of the present invention;

FIG. 2 is a SEM image showing the surface and cross-section of a structure including a silicon wafer as a support;

FIG. 3 is a SEM image showing the surface and cross-section of a structure including a glass plate as a support;

FIG. 4 is a SEM image showing the surface and cross-section of a structure including an ITO-coated glass plate as a support;

FIG. 5 is a SEM image showing the surface and cross-section of a structure including a tungsten wire as a support;

FIG. 6 is a digital image showing a structure including a silicon wafer having a large area as a support;

FIG. 7 is a SEM image showing the surface and cross-section of a structure manufactured using another co-surfactant;

FIG. 8 is a SEM image showing the surface and cross-section of a structure manufactured without using a co-surfactant;

FIG. 9 is a SEM image showing the surface of a silicon wafer used for the manufacture of the structure;

FIG. 10 is a SEM image showing the surface of a structure manufactured using a changed amount of co-surfactant;

FIG. 11 is a SEM image showing the surface of a structure manufactured for a changed reaction time;

FIG. 12 is a SEM image showing the surface of a structure manufactured at a changed reaction temperature;

FIG. 13 is a SEM image showing the surface of a structure manufactured using another co-surfactant while the reaction temperature and the reaction time are adjusted; and FIG. 14 is a SEM image showing the surface of a patterned structure manufactured using a shadow mask.

DESCRIPTION OF THE PREFERRED EMBODIMENTS

Hereinafter, a mesoporous silica film structure having ultra-large pores therein and a method of manufacturing the same according to the present invention will be described with reference to the accompanying drawings. Unless otherwise specified, all terms in this specification have the same meanings as general meanings of the terms understood by a person skilled in the art to which the present invention pertains, and if there is a conflict with the meaning of the term used in this specification, the term follows the definition used in this specification. In addition, detailed descriptions of known functions and configurations that may unnecessarily obscure the subject matter of the present invention will be omitted. Throughout the specification, when a part is said to "include" a certain component, it means that the component may further include other components, rather than excluding other components, unless otherwise specified.

A method of manufacturing a mesoporous silica film structure having ultra-large pores therein according to an embodiment of the present invention will be described with reference to FIGS. 1 to 14. The manufacturing method includes a pretreatment step of pretreating a support so that micelles and silica are deposited on the support, a micelle formation step of mixing a cationic surfactant and an anionic co-surfactant for forming the micelles at a predetermined ratio in a support-carried water tank prepared in the pretreatment step, followed by heating, thus forming enlarged micelles on the support through magnetic bonding of the cationic surfactant and the anionic co-surfactant, a silica deposition step of supplying a silica precursor solution to the water tank, followed by heating, thus depositing silica on the support after the micelle formation step, and a washing step of washing the support so that residual materials (containing the micelles) are removed after the silica deposition step. The mesoporous silica film structure having the ultra-large pores therein will be described before specifically describing the manufacturing method. The structure includes a support 1 and a film 2, which is formed in a predetermined thickness (100 to 300 nm) on the support, includes silica, and has a mesoporous form. The film has ultra-large pores therein (preferably having a diameter of 2 to 50 nm and more preferably a diameter of 10 to 50 nm).

The pretreatment step is a step of pretreating the support so that the micelles and silica are deposited on the support, and supports including various materials and having various shapes may be used. For example, two-dimensional surfaces of various materials, such as a silicon wafer, a glass plate, an ITO-coated glass plate, a plastic plate, a metal plate, a flexible film, and a transparent film, and three-dimensional supports, such as a line, a rod, and a sphere, may be used. For example, the silicon wafer, the glass plate, or the ITO-coated glass plate may be immersed in an isopropanol solution, ultrasonically washed, rinsed using distilled water, dipped in a Piranha solution, rinsed using distilled water, and stored in an ethanol solution, thereby achieving the pretreatment step. A tungsten wire may be immersed in an isopropanol solution, ultrasonically washed, rinsed using distilled water, dipped in a NaOH solution, rinsed using distilled water, and stored in an ethanol solution, thereby achieving the pretreatment step.

The micelle formation step is a step of mixing the cationic surfactant and the anionic co-surfactant for forming the micelles at a predetermined ratio in the support-carried water tank prepared in the pretreatment step, followed by heating, thus forming enlarged micelles on the support through magnetic bonding of the cationic surfactant and the anionic co-surfactant. For example, CTAC (cetyl trimethyl ammonium chloride) may be used as the cationic surfactant. One or more selected from the group consisting of sodium salicylate (NaSal), salicylic acid, sodium benzoate (NaBen), benzoic acid, sodium methoxybenzoate, 2-methoxybenzoic acid, sodium cinnamate, cinnamic acid, sodium hydroxycinnamate, hydrocinnamic acid, sodium methoxycinnamate, methoxycinnamic acid, sodium 3-phenylpropanate, and 3-hydroxyphenylpropanoic acid may be used as the anionic co-surfactant. It is preferable that the anionic co-surfactant be used in an amount of 0.1 to 3 moles based on 1 mole of the cationic surfactant. The principle whereby the micelles having an enlarged size are formed during the micelle formation step will be specifically described using CTAC and NaSal as examples. When only CTAC is used, $CTA^+$ forms the micelles by itself. When the anionic co-surfactant ($Sal^-$) is present, the co-surfactant may be inserted into the (+) charge of the head portion of the $CTA^+$ due to the (−) charge thereof. That is, the repulsive force of the head portion is reduced, and the density of the micelle is increased. Accordingly, new magnetic bonding occurs between $CTA^+$ and the co-surfactant, thereby forming the enlarged micelles. For example, the support may be placed in a water tank containing water and TEA, agitated, heated, and ultrasonicated to remove air bubbles present on the surface thereof. The cationic surfactant and the anionic co-surfactant may be added thereto at a predetermined ratio, and an agitated and heated state may then be maintained, thereby performing the micelle formation step.

The silica deposition step is a step of supplying the silica precursor solution to the water tank, followed by heating, thus depositing silica on the support after the micelle formation step. Since multiple micelles are deposited on the support, silica fills the spaces between the micelles, thereby accomplishing the deposition of the mesoporous structure. Since the above-described micelle has a size greater than that of a conventional micelle, a thin film including silica and having a mesoporous structure is provided with ultra-large pores. In the silica deposition step, the precursor solution has a pH of 6 to 9 and is maintained at a temperature of 40 to 80° C.

The washing step is a step of washing the support so that residual materials (containing the micelles) are removed after the silica deposition step. Through the washing step, a structure including the support and the mesoporous silica film, which is formed on the support and which has the ultra-large pores, may be obtained. For example, ultrasonication may be performed sequentially using ethanol, distilled water, and ethanol so that the residual materials present on the surface thereof are removed, thereby achieving the washing step. In the manufacturing method, the mesoporous film having the ultra-large pores therein may be formed on supports including various materials (silicon, glass, metal, and plastics) and having various shapes (a plate, a rod, a line, a sphere, and a flexible film) under chemically mild conditions (pH of 6 to 9, 40 to 80° C.). The ratio of the cationic surfactant and the anionic co-surfactant, the reaction temperature, and the reaction time may be adjusted to control the size of the pores in the film and to form the mesoporous film having the ultra-large pores therein on a support having a large area.

A manufacturing method according to another embodiment of the present invention may further include a mask-bonding step of bonding a shadow mask to the support between the pretreatment step and the micelle formation step. A patterned mesoporous silica film having ultra-large pores therein may be formed on the support. The shadow mask may include, for example, PDMS, and may have a hole formed vertically therethrough. When the micelle formation step, the silica deposition step, and the washing step are performed after the mask-bonding step, a mesoporous silica layer having an ultra-large pore corresponding in shape to the hole may be formed, and a patterned silica film may be formed on the support using a shadow mask having a hole having a specific shape.

Another embodiment of the present invention relates to a structure manufactured using the method of manufacturing the mesoporous silica film structure having the ultra-large pores therein.

Hereinafter, the present invention will be described in more detail with reference to Examples. However, these are only for explaining the present invention in more detail, and the scope of the present invention is not limited thereto.

<Example 1> Pretreatment of Support

1. As supports, a silicon wafer (having a diameter of 1 cm), a silicon wafer having a large area (3 cm×3 cm), a glass plate (having a diameter of 1 cm), an ITO-coated glass plate (having a diameter of 1 cm), and a tungsten wire (having a diameter of 1 mm and a length of 2 cm) were prepared.

2. The silicon wafer, the silicon wafer having a large area, the glass plate, and the ITO-coated glass plate were immersed in an isopropanol solution, ultrasonically washed for 15 minutes, rinsed using distilled water, dipped in a Piranha solution for 30 minutes, rinsed using distilled water, and stored in an ethanol solution.

3. The tungsten wire was immersed in an isopropanol solution, ultrasonically washed for 15 minutes, rinsed using distilled water, dipped in a 1 mM NaOH solution for 5 hours, rinsed using distilled water, and stored in an ethanol solution.

<Example 2> Formation of Mesoporous Film Structure

1. The silicon wafer pretreated in Example 1 was fixed to a holder so as to be immobilized during a reaction process, placed in a reaction tank containing 94.4 mL of water and 272 mg of TEA, and heated at 80° C. for 30 minutes with agitation. The reaction tank was ultrasonicated for 6 minutes to remove air bubbles present on the surface of a support, and 3.548 mM NaSal and 4.175 mM CTAC (CTAC/NaSal=1.18) were then added. Thereafter, agitation and heating were maintained for 1 hour, and 10 mL of TEOS was added to the reaction tank in such a way that 1 mL of TEOS was repeatedly added ten times, followed by reaction under the same agitation and temperature conditions for 1 hour. After the reaction was completed, ultrasonication was performed in ethanol for 15 minutes, distilled water for 15 minutes, and ethanol for 15 minutes, thus removing residual materials present on the surface thereof, thereby manufacturing a structure in which a mesoporous silica film was formed on a support.

2. A structure in which a mesoporous silica film was formed on a support was manufactured using the same method as in sub-item 1 of Example 2, except that the glass plate pretreated in Example 1 was used instead of the silicon wafer.

3. A structure in which a mesoporous silica film was formed on a support was manufactured using the same method as in sub-item 1 of Example 2, except that the ITO-coated glass plate pretreated in Example 1 was used instead of the silicon wafer.

4. A structure in which a mesoporous silica film was formed on a support was manufactured using the same method as in sub-item 1 of Example 2, except that the tungsten wire pretreated in Example 1 was used instead of the silicon wafer.

5. A structure in which a mesoporous silica film was formed on a support was manufactured using the same method as in sub-item 1 of Example 2, except that the silicon wafer having a large area pretreated in Example 1 was used instead of the silicon wafer.

6. A structure in which a mesoporous silica film was formed on a support was manufactured using the same method as in sub-item 1 of Example 2, except that NaBen (CTAC/NaBen=1.18) was used instead of NaSal. Meanwhile, in sub-items 1 to 6 of Example 2, the reaction was performed at a pH in the range of 6 to 9.

<Example 3> Structural Analysis of Mesoporous Film Structure

1. Structural analysis of the structure manufactured in Example 2 was performed, and the results are shown in FIGS. 2 to 7. FIG. 2 is a SEM image showing the surface (a) and the cross-section (b) of the structure manufactured in sub-item 1 of Example 2. FIG. 3 is a SEM image showing the surface (a) and the cross-section (b) of the structure manufactured in sub-item 2 of Example 2. FIG. 4 is a SEM image showing the surface (a) and the cross-section (b) of the structure manufactured in sub-item 3 of Example 2. FIG. 5 is a SEM image showing the surface (a) and the cross-section (b) of the structure manufactured in sub-item 4 of Example 2. FIG. 6 is a digital image showing the surface (b) of the structure manufactured in sub-item 5 of Example 2 (in which (a) is a digital image showing the silicon wafer having a large area treated in Example 1). FIG. 7 is a SEM image showing the surface (a) and the cross-section (b) of the structure manufactured in sub-item 6 of Example 2. Further, FIG. 8 is a SEM image showing the surface (a) and the cross-section (b) of the structure manufactured using the same method as in sub-item 1 of Example 2, except that NaSal was not used. FIG. 9 is a SEM image showing the surface of the silicon wafer treated in Example 1.

2. From FIGS. 2 to 9, it can be seen that a pore size was as small as several nm when the co-surfactant was not used, but that a mesoporous silica film having a pore size of several tens of nm was formed when the co-surfactant was used. Meanwhile, when CTAC was not used and only the co-surfactant was used, pores were not formed. Further, from FIGS. 2 to 7, it can be seen that a mesoporous silica layer having ultra-large pores therein was formed to a predetermined thickness (100 to 300 nm) on the silicon, glass, ITO-coated glass, and tungsten wire. Accordingly, it can be seen that the mesoporous silica film having the ultra-large pore size may be formed on supports including various materials and having various shapes in the present invention. Further, from FIG. 6, it can be seen that the mesoporous silica film having the ultra-large pores therein may be formed on a support having a large area.

<Example 4> Confirmation of Possibility of Adjusting Pore Size of Structure

1. A structure was manufactured using the same method as in sub-item 1 of Example 2, except that the molar ratio of CTAC and NaSal was changed. The structural analysis of the structure (surface) was performed using a SEM, and the results are shown in FIG. 10.

2. A structure was manufactured using the same method as in sub-item 1 of Example 2, except that the reaction time was changed. The structural analysis of the structure (surface) was performed using a SEM, and the result is shown in FIG. 11.

3. A structure was manufactured using the same method as in sub-item 1 of Example 2, except that the reaction temperature was changed. The structural analysis of the structure (surface) was performed using a SEM, and the result is shown in FIG. 12.

4. A structure was manufactured using the same method as in sub-item 6 of Example 2, except that the reaction temperature and time were changed. The structural analysis of the structure (surface) was performed using a SEM, and the result is shown in FIG. 13.

5. From FIGS. 10 to 13, it can be seen that the ratio of the co-surfactant and CTAC that were used and the reaction time and temperature are adjusted to thus control the pore size of the mesoporous silica film having the ultra-large pores therein.

<Example 5> Confirmation of Possibility of Formation of Patterned Mesoporous Film 1. Formation of PDMS Shadow Marks A PDMS elastomer base and a curing agent were mixed at a mass ratio of 10:1 and then thinly applied on a glass plate. Air bubbles were removed in a vacuum oven at 60° C. for 1 hour, and solidifying was performed to form a hole having a diameter of 0.5 mm, thereby forming a PIMS shadow mask.

2. Confirmation of Formation of Structure Having Patterned Mesoporous Film (1) A structure in which a mesoporous silica film was formed on a support was manufactured using the same method as in sub-item 1 of Example 2, except that a PIMS shadow mask was placed on the upper surface of the silicon wafer pretreated in Example 1 and was then fixed using a holder. The structural analysis of the structure (surface) was performed using a SEM, and the result is shown in FIG. 14.

(2) From FIG. 14, it can be seen that a mesoporous silica film having an ultra-large pore corresponding in shape to the hole in the shadow mask was formed on the silicon wafer. Accordingly, it can be seen that a patterned mesoporous film having an ultra-large pore may be formed on the support using shadow masks having various shapes.

Although the applicant has described preferred embodiments of the present invention above, such embodiments are only one embodiment for implementing the technical spirit of the present invention, and any changes or modification examples should be interpreted as belonging to the scope of the present invention as long as the technical spirit of the present invention is implemented.

What is claimed is:

1. A method of manufacturing a mesoporous silica film structure, the method comprising:
   a pretreatment step of immersing a tungsten wire, which is the support, in an isopropanol solution, ultrasonically washing the tungsten wire, rinsing the tungsten wire using distilled water, dipping the tungsten wire in a NaOH solution, rinsing the tungsten wire using distilled water, and storing the tungsten wire in an ethanol solution;
   a micelle formation step of adding the support to the water tank containing water and Triethylamine (TEA), performing agitation and heating, ultrasonicating the water tank to remove air bubbles present on a surface of the support, adding the cationic surfactant and the anionic co-surfactant at a predetermined ratio, and maintaining an agitated and heated state, mixing a cationic surfactant and an anionic co-surfactant for forming micelles at a predetermined ratio in a water tank, followed by heating, thus forming micelles magnetic bonded by the cationic surfactant and the anionic co-surfactant on a support;
   a silica deposition step of supplying a silica precursor solution to the water tank, followed by heating, thus depositing silica on the support after the micelle formation step; and
   a washing step of washing the support so that residual materials containing the micelles are removed to thus obtain a structure including the support and a mesoporous silica film formed on the support after the silica deposition step.

2. The method of claim 1, wherein cetyl trimethyl ammonium chloride (CTAC) is used as the cationic surfactant, and one or more selected from the group consisting of sodium salicylate, salicylic acid, sodium benzoate, benzoic acid, sodium methoxybenzoate, 2-methoxybenzoic acid, sodium cinnamate, cinnamic acid, sodium hydroxycinnamate, hydrocinnamic acid, sodium methoxycinnamate, methoxycinnamic acid, sodium 3-phenylpropanate, and 3-hydroxyphenylpropanoic acid are used as the anionic co-surfactant.

3. The method of claim 1, wherein the anionic co-surfactant is used in an amount of 0.1 to 3 moles based on 1 mole of the cationic surfactant.

4. The method of claim 1, wherein the film has a thickness of 100 to 300 nm and includes pores having a diameter of 10 to 50 nm.

5. The method of claim 1, wherein a ratio of the cationic surfactant and the anionic co-surfactant, a reaction temperature, and a reaction time are adjusted to control a pore size of the film.

6. The method of claim 1, wherein in the silica deposition step, the precursor solution has a pH of 6 to 9 and is maintained at a temperature of 40 to 80° C.

7. The method of claim 1, wherein any one among silicon, glass, ITO-coated glass, plastic, metal, a flexible film, and a transparent film is used as the support.

8. The method of claim 1, wherein the support has any one shape among a plate, a rod, and a sphere.

9. The method of claim 1, further comprising:
   a mask-bonding step of bonding a shadow mask to the support between a pretreatment step and the micelle formation step,
   wherein a patterned mesoporous silica film having pores therein is formed on the support.

10. The method of claim 9, wherein the shadow mask includes Polydimethylsiloxane (PDMS) and has a hole formed vertically therethrough.

* * * * *